United States Patent
Koo et al.

(10) Patent No.: US 12,082,420 B2
(45) Date of Patent: *Sep. 3, 2024

(54) SEMICONDUCTOR DEVICE INCLUDING INTERLAYER INSULATION STRUCTURE INCLUDING METAL-ORGANIC FRAMEWORK

(71) Applicant: SK hynix Inc., Icheon-si (KR)

(72) Inventors: Won Tae Koo, Icheon-si (KR); Jae Hyun Han, Icheon-si (KR); Se Ho Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/472,365

(22) Filed: Sep. 10, 2021

(65) Prior Publication Data

US 2022/0336497 A1   Oct. 20, 2022

(30) Foreign Application Priority Data

Apr. 15, 2021   (KR) .......................... 10-2021-0049477

(51) Int. Cl.
*H10B 51/20* (2023.01)
*H01L 29/06* (2006.01)

(52) U.S. Cl.
CPC ......... *H10B 51/20* (2023.02); *H01L 29/0649* (2013.01)

(58) Field of Classification Search
CPC ........ H10B 51/20; H10B 43/10; H10B 43/27; H10B 51/10; H10B 43/35; H10B 51/30; H10B 43/30; H01L 29/0649; H01L 29/66833; H01L 29/6684; H01L 29/78391; H01L 29/792; H01L 23/5329; H01L 21/764; H01L 21/02112; H01L 21/76837

See application file for complete search history.

(56) References Cited

U.S. PATENT DOCUMENTS

| | | | |
|---|---|---|---|
| 9,117,771 B2 | 8/2015 | Seifert et al. | |
| 10,256,247 B1 | 4/2019 | Kanakamedala et al. | |
| 2011/0297869 A1 | 12/2011 | Seifert et al. | |
| 2016/0322368 A1 | 11/2016 | Sun et al. | |
| 2021/0193585 A1* | 6/2021 | Said | H01L 23/53266 |
| 2021/0193674 A1* | 6/2021 | Said | H01L 21/02244 |
| 2022/0059462 A1* | 2/2022 | Said | H01L 21/02244 |
| 2023/0013343 A1* | 1/2023 | Koo | H01L 29/4234 |

FOREIGN PATENT DOCUMENTS

| | | |
|---|---|---|
| CN | 109494184 A | 3/2019 |
| CN | 109755249 A | 5/2019 |
| KR | 102123545 B1 | 6/2020 |

* cited by examiner

*Primary Examiner* — Dao H Nguyen
(74) *Attorney, Agent, or Firm* — WILLIAM PARK & ASSOCIATES LTD.

(57) ABSTRACT

A semiconductor device according to an embodiment of the present disclosure includes a substrate, a gate structure disposed over the substrate, a dielectric structure disposed to contact a sidewall surface of the gate structure over the substrate, and a channel layer disposed on a sidewall surface of the dielectric structure over the substrate. The gate structure includes a gate electrode layer and an interlayer insulation structure which are alternately stacked. The interlayer insulation structure includes a metal-organic framework layer.

16 Claims, 18 Drawing Sheets

SEMICONDUCTOR DEVICE INCLUDING INTERLAYER INSULATION STRUCTURE INCLUDING METAL-ORGANIC FRAMEWORK

CROSS-REFERENCE TO RELATED APPLICATIONS

The present application claims priority under 35 U.S.C 119(a) to Korean Applications No. 10-2021-0049477, filed on Apr. 15, 2021, which is incorporated herein by reference in its entirety.

BACKGROUND

1. Technical Field

The present disclosure generally relates to a semiconductor device and, more particularly, to a semiconductor device including an interlayer insulation structure.

2. Related Art

According to the trend of decreasing design rules and increasing degree of integration, semiconductor devices having a three-dimensional (3D) stack structure have appeared. As an example of the semiconductor devices having the 3D stack structure, there is a NAND-type flash memory including a channel layer extending in a direction perpendicular to a substrate, and a plurality of memory cells sharing the channel layer with each other.

Recently, in the memory devices having the 3D stack structure, in order to increase the degree of integration of memory cells, attempts have been made to reduce the thicknesses of interlayer insulation layers that insulate a plurality of memory cells stacked on the substrate from each other. However, when the thickness of the interlayer insulation layer is reduced, parasitic capacitance acting between neighboring memory cells may increase and signal interference between neighboring memory cells may increase. Accordingly, in a semiconductor device having a three-dimensional stack structure, research on a semiconductor stacking technology capable of obtaining an improved degree of integration with a reliable signal processing operation has been continuously conducted.

SUMMARY

A semiconductor device according to an embodiment of the present disclosure may include a substrate, a gate structure disposed over the substrate, a dielectric structure disposed to contact a sidewall surface of the gate structure over the substrate, and a channel layer disposed on a sidewall surface of the dielectric structure over the substrate. The gate structure may include a gate electrode layer and an interlayer insulation structure which are alternately stacked. The interlayer insulation structure may include a metal-organic framework layer.

A semiconductor device according to another embodiment of the present disclosure may include a substrate, a gate structure disposed over the substrate, a dielectric structure disposed to contact a sidewall surface of the gate structure over the substrate, and a vertical electrode layer disposed on a sidewall surface of the dielectric structure over the substrate and extending in a direction substantially perpendicular to a surface of the substrate. The gate structure may include a horizontal electrode layer and an interlayer insulation structure which are alternately stacked. The interlayer insulation structure may include a metal-organic framework layer.

There is disclosed a method of manufacturing a semiconductor device according to another embodiment. In the method of manufacturing a semiconductor device, a substrate is prepared. A stack structure is formed over the substrate. The stack structure may include insulating material layers and sacrificial layers which are alternately stacked each other. The stack structure may be selectively etched over the substrate to expose a sidewall surface of the stack structure. The sacrificial material layers may be removed through the exposed sidewall surface to form recess spaces. Metal-organic framework layers may be formed on the insulating material layers. First conduction layers may be formed by filling the recess spaces with a conductive material. The first conduction layers may be disposed between the metal-organic framework layers. A dielectric structure contacting the metal-organic framework layers and the first conduction layers may be formed over the substrate. A second conduction layer contacting the dielectric layer may be formed over the substrate.

A semiconductor device according to an embodiment of the present disclosure may include a substrate, a gate structure disposed over the substrate, a dielectric structure disposed to contact a sidewall surface of the gate structure over the substrate, and a channel layer disposed on a sidewall surface of the dielectric structure over the substrate. The gate structure may include a gate electrode layer and an interlayer insulation structure which are stacked. The interlayer insulation structure may include a metal-organic framework.

DETAILED DESCRIPTION

Figure 1:
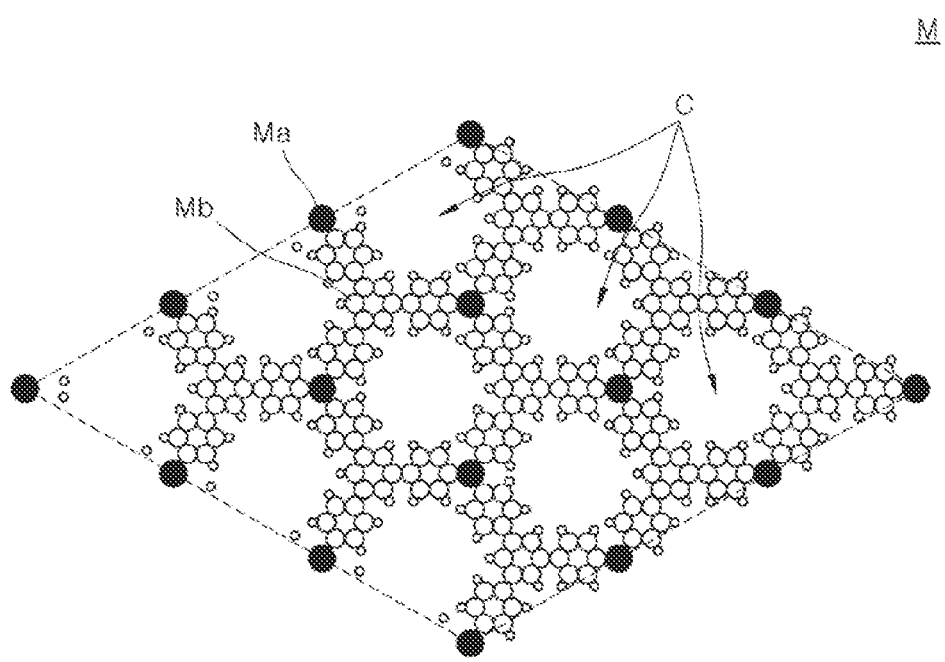
FIG. 1 is a view schematically illustrating a metal-organic framework according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the x-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Various embodiments of the present disclosure may provide an interlayer insulation structure that electrically insulates different conductive layers adjacent to each other in a direction perpendicular to a substrate, in a stack structure disposed over the substrate and including a plurality of conductive layers. The interlayer insulation structure may include a metal-organic framework layer. The metal-organic framework layer may mean that the metal-organic framework is present in a form of a thin film. The metal-organic framework may be a porous material formed by bonding a node including a metal and an organic ligand. The metal-organic framework may have a two-dimensional structure or a three-dimensional structure.

Figure 2:
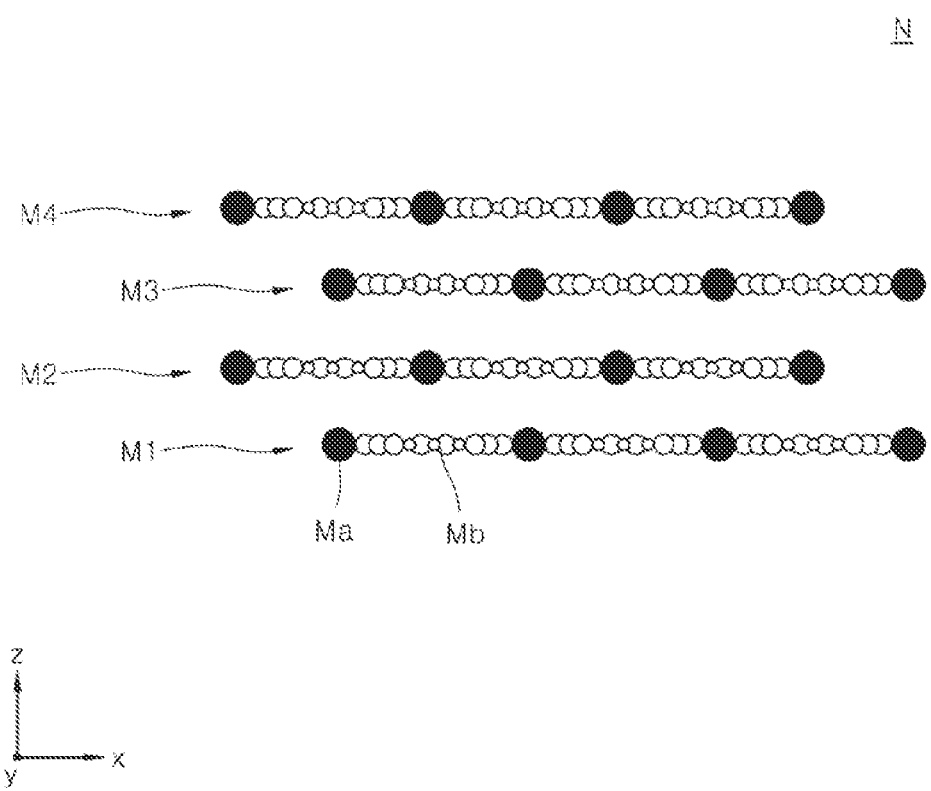
FIG. 2 is a view schematically illustrating a metal-organic framework layer according to an embodiment of the present disclosure.

FIG. 1 is a view schematically illustrating a metal-organic framework according to an embodiment of the present disclosure. FIG. 2 is a view schematically illustrating a metal-organic framework layer according to an embodiment of the present disclosure.

Referring to FIG. 1, The metal-organic framework M may have the two-dimensional structure. The metal-organic framework M may be a material formed by bonding a node Ma including metal and an organic ligand Mb. The node Ma including metal may be, for example, a metal ion or a metal cluster.

In the metal-organic framework M, the metal constituting the node Ma may include, for example, zinc (Zn), chromium (Cr), indium (In), gallium (Ga), copper (Cu), iron (Fe), molybdenum (Mo), cobalt (Co), ruthenium (Ru), manganese (Mn), lanthanum (La), titanium (Ti), hafnium (Hf), cadmium (Cd), zirconium (Zr), or the like. In the metal-organic framework M, the organic ligand Mb may include, for example, oxalic acid, fumaric acid, benzenehexathiol, triphenylenehexathiol), 1-4, benzene dicarboxylic acid, hexaaminobenzene, tetrakis(4-carboxyphenyl)-porphyrinato-cobalt (II), tetrakis(4-carboxyphenyl)-porphyrin, or the like. The organic ligand Mb may include, as another example, $H_2BDC$, $H_2BDC$-Br, $H_2BDC$-OH, $H_2BDC$-NO2, $H_2BDC$-$NH_2$, $H_4DOT$, $H_2BDC$-$(Me)_2$, $H_2BDC$-$(Cl)_2$, or the like.

Referring to FIG. 1, the metal-organic framework M may have a porous structure including cavities C. In an embodiment, the metal-organic framework M may have a physically and chemically stable two-dimensional network bonding structure. As illustrated in FIG. 1, in the metal-organic framework M, a coordination bonding between the node Ma including metal and the organic ligand Mb may be regularly formed in two dimensions. The metal-organic framework M may exist in a form of a sheet having a thickness of a nano size (e.g., 1 nm to 100 nm).

In some other embodiments not shown in FIG. 1, the metal-organic framework M may have the three-dimensional structure. The node Ma including metal and an organic ligand Mb are disposed at fixed positions in a three-dimensional unit cell. For example, the metal-organic framework M having the three-dimensional structure may include zeolitic imidazolate frameworks that is denoted as ZIF-N (N is 1 to 12). The metal-organic framework M having the three-dimensional structure may have a porous structure including cavities C.

Referring to FIG. 2, the metal-organic framework layer N may include a plurality of metal-organic frameworks M1, M2, M3, and M4. In an embodiment, the metal-organic framework layer N may have a form in which the plurality of metal-organic frameworks M1, M2, M3, and M4 having a sheet shape are stacked in a thickness direction (i.e., z-direction). The metal-organic frameworks M1, M2, M3, and M4 may be bonded to each other by a van der Waals force acting in a direction (i.e., z-direction) perpendicular to a surface of the sheet to form the metal-organic framework layer N.

Referring to FIGS. 1 and 2, the metal-organic framework layer N may secure a low permittivity by the cavities inside the metal-organic framework layer N. As an example, the permittivity of the metal-organic framework layer N may be lower than that of silicon oxide. As an example, the dielectric constant K of the metal-organic framework layer N may be 2 or lower. In addition, as the metal-organic framework M of FIG. 1 has a stable two-dimensional network bonding structure, the metal-organic framework layer N, which is a stack of the plurality of metal-organic frameworks M1, M2, M3, and M4, may maintain a structurally stable state.

In some other embodiments not shown in FIGS. 1 and 2, the metal-organic framework layer N may include the metal-organic framework having the three-dimensional structure. Because the metal-organic framework has the porous structure including cavities C, the metal-organic framework layer N may secure a low permittivity. As an example, the dielectric constant K of the metal-organic framework layer N may be 2 or lower.

Figure 3:
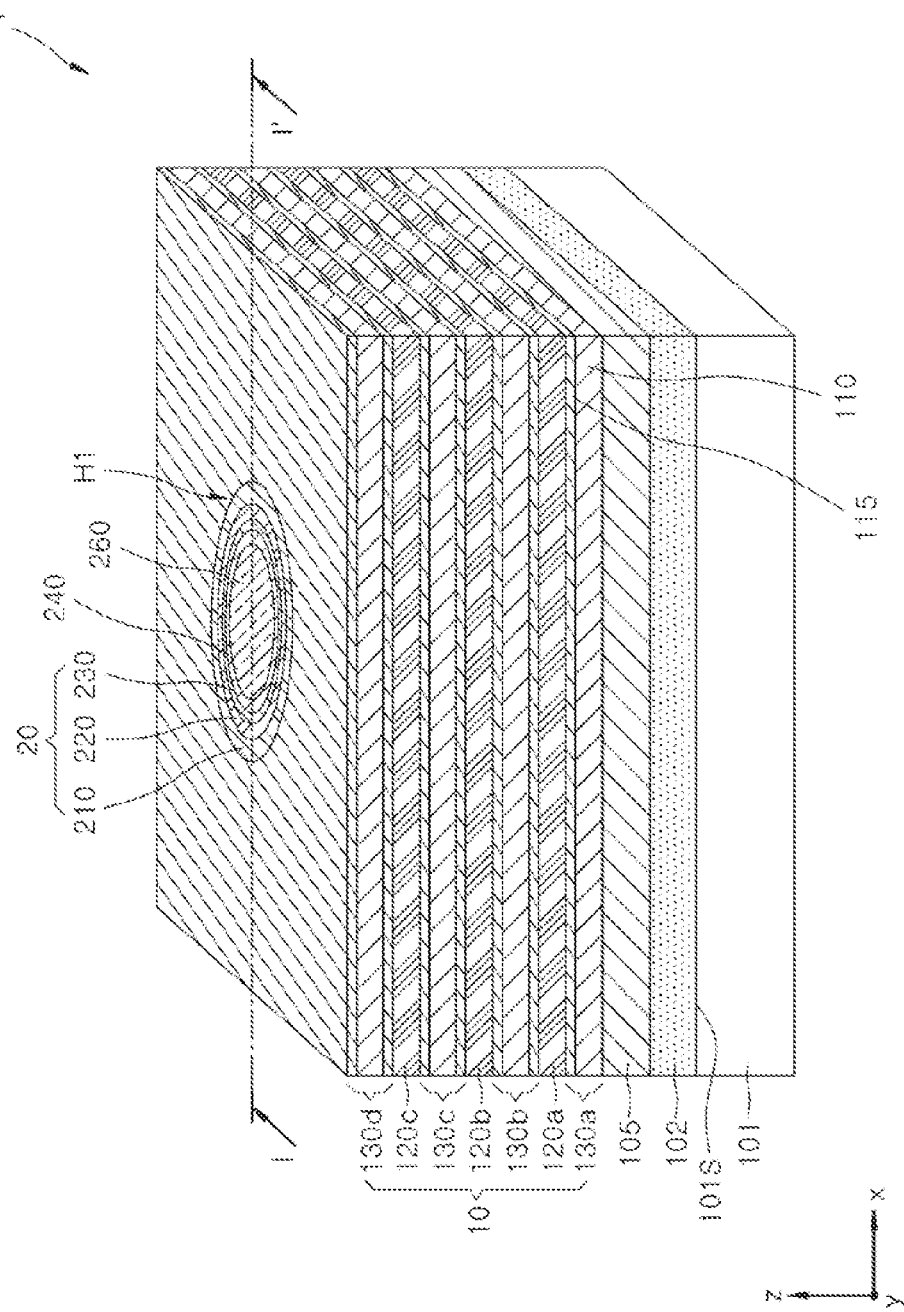
FIG. 3 is a perspective view schematically illustrating a semiconductor device according to an embodiment of the present disclosure.
Figure 4:
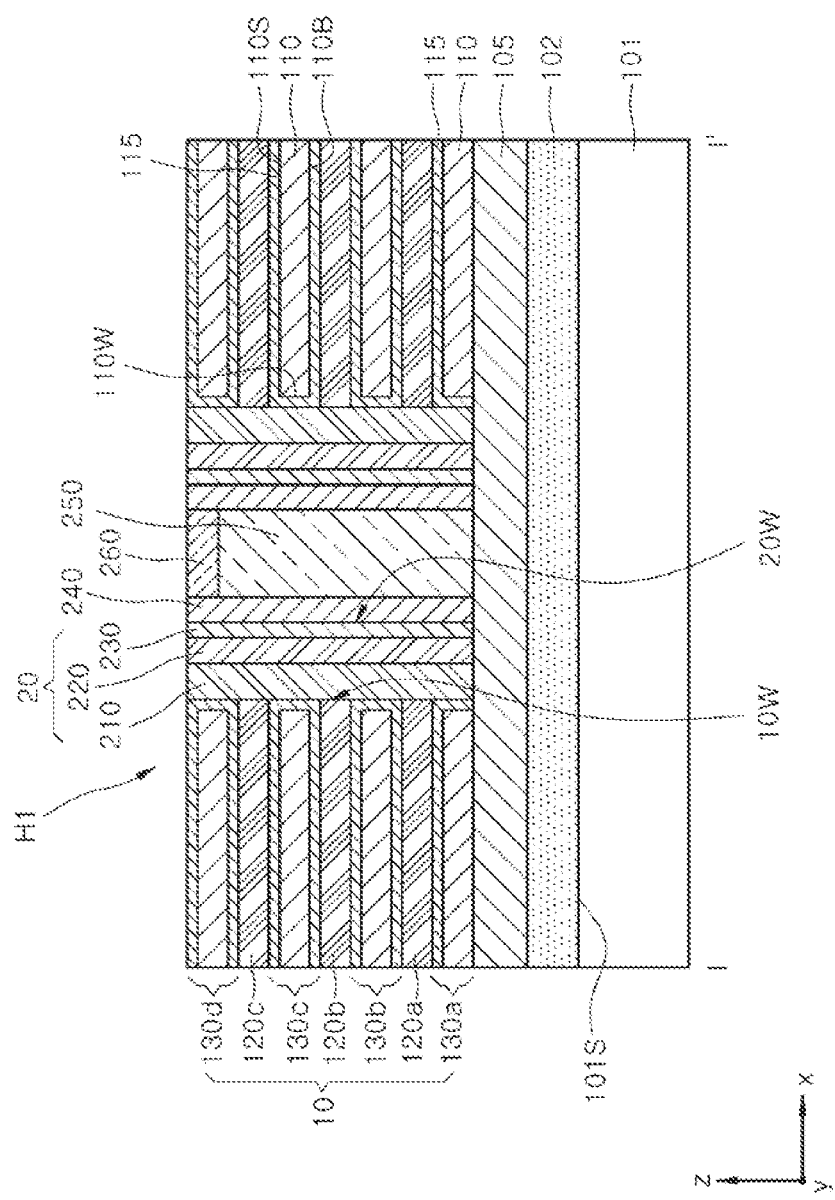
FIG. 4 is a cross-sectional view taken along line I-I' of the semiconductor device of FIG. 3.
Figure 5:
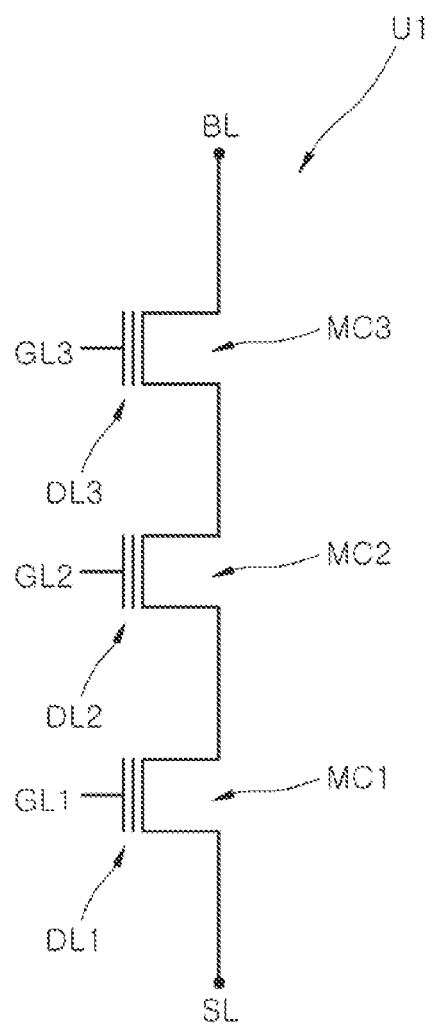
FIG. 5 is an electric circuit diagram of the semiconductor device in connection with FIGS. 3 and 4.
Figure 6:
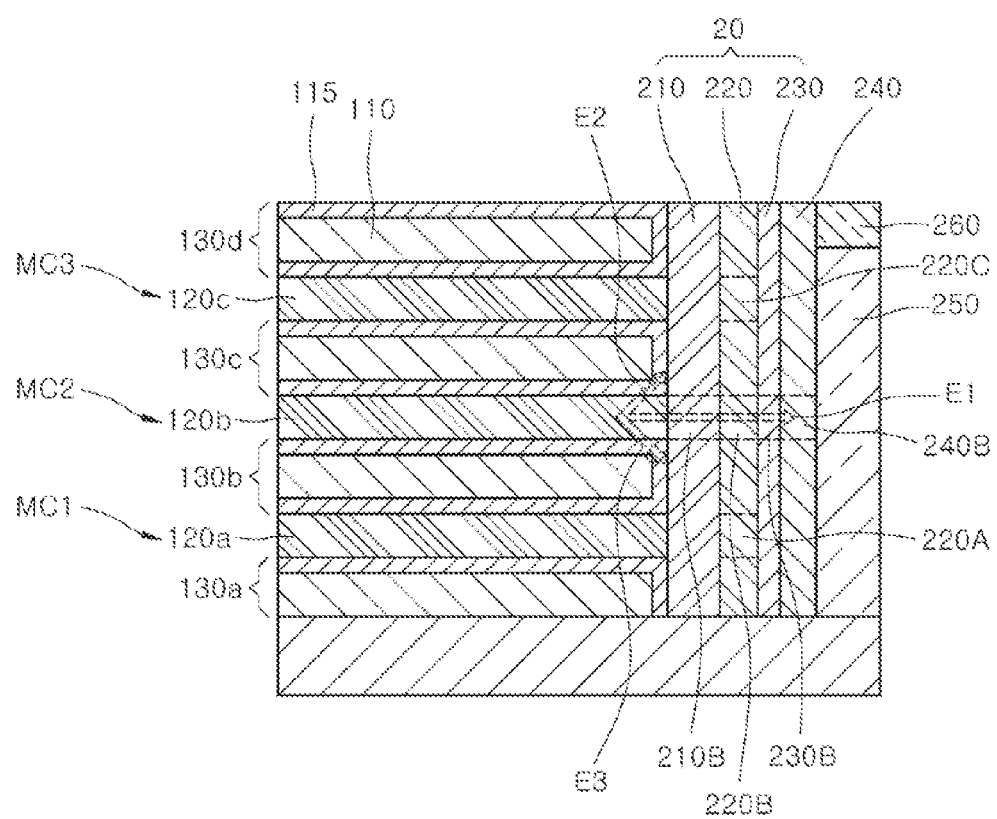
FIG. 6 is a view schematically illustrating a method of operating the semiconductor device in connection with FIGS. 3 and 4.

FIG. 3 is a perspective view schematically illustrating a semiconductor device 1 according to an embodiment of the present disclosure. FIG. 4 is a cross-sectional view taken along line I-I' of the semiconductor device of FIG. 3. FIG. 5 is an electric circuit diagram of the semiconductor device in connection with FIGS. 3 and 4. FIG. 6 is a view schematically illustrating a method of operating the semiconductor device in connection with FIGS. 3 and 4.

Referring to FIGS. 3 and 4 together, the semiconductor device 1 may include a substrate 101, a gate structure 10 disposed over the substrate 101, a dielectric structure 20 disposed to contact a sidewall surface 10W of the gate structure 10 over the substrate 101, and a channel layer 240 disposed on a sidewall surface 20W of the dielectric structure 20 over the substrate 101. The channel layer 240 may extend in a first direction (i.e., z-direction) perpendicular to a surface 101S of the substrate 101. A channel lower contact layer 105 and a channel upper contact layer 260 may be disposed at opposite ends of the channel layer 240 extending in the z-direction, respectively.

The substrate 101 may include a semiconductor material. For example, the semiconductor material may include silicon (Si), germanium (Ge), gallium arsenide (GaAs), or the like.

A base insulation layer 102 may be disposed on the substrate 101. The base insulation layer may include an insulating material. The insulating material may include, for example, oxide, nitride, oxynitride, or a combination of two or more thereof.

Although not illustrated in FIG. 1, the substrate 101 may include an integrated circuit. The integrated circuit may constitute an active element such as a diode or a transistor. At least one conductive layer and at least one insulation layer may be disposed between the substrate 101 and the base insulation layer 102. The conductive layer and the insulation layer may constitute a passive element such as a capacitor or a resistor.

Referring to FIGS. 3 and 4 together, the channel lower contact layer 105 may be disposed on the base insulation layer 102. The channel lower contact layer 105 may be electrically connected to the channel layer 240. Although not illustrated, the channel lower contact layer 105 may be electrically connected to a source line. The channel lower contact layer 105 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 3 and 4 together, the gate structure 10 may be disposed on the channel lower contact layer 105. The gate structure 10 may include first to third gate electrode layers 120a, 120b, and 120c and first to fourth interlayer insulation structures 130a, 130b, 130c, and 130d which are alternately stacked along the first direction (i.e., z-direction) perpendicular to the surface 101S of the substrate 101. The first interlayer insulation structure 130a may be disposed to contact the channel lower contact layer 105. The fourth interlayer insulation structure 130d may be disposed at an uppermost layer of the gate structure 10.

The first to third gate electrode layers 120a, 120b, and 120c may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 4, the first to fourth interlayer insulation structures 130a, 130b, 130c, and 130d may include an inner insulation layer 110 and a metal-organic framework layer 115 disposed on the inner insulation layer 110. The metal-organic framework layer 115 may be disposed to surround the corresponding inner insulation layer 110. Specifically, in the first interlayer insulation structure 130a, the metal-organic framework layer 115 may be disposed to surround an upper surface 110S and a sidewall surface 110W of the inner insulation layer 110. In the second to fourth interlayer insulation layers 130b, 130c, and 130d, the metal-organic framework layers 115 may be disposed to surround the upper surfaces 110S, lower surfaces 110B, and the sidewall surfaces 110W of the inner insulation layers 110.

The inner insulation layers 110 may include an insulating material. The insulating material may include, for example, oxide, nitride, oxynitride, or a combination of two or more thereof.

The metal-organic framework layer 115 may include the metal-organic framework M described above with reference to FIG. 1. The metal-organic framework layer 115 may be the metal-organic framework layer N described above with reference to FIG. 2. That is, the metal-organic framework layer 115 may have a form in which a plurality of sheet-type metal-organic frameworks M1, M2, M3, and M4 are stacked in a thickness direction (i.e., z-direction), as illustrate in FIG. 2.

Referring to FIGS. 3 and 4 together, the gate structure 10 may include a hole pattern H1. The hole pattern H1 may penetrate the gate structure 10 to expose the channel lower contact layer 105. In addition, the hole pattern H1 may expose the sidewall surface 10W of the gate structure 10.

The dielectric structure 20 may be disposed to contact the sidewall surface 10W of the gate structure 10 located inside the hole pattern H1, over the channel lower contact layer 105. The dielectric structure 20 may be a structure extending in the first direction (i.e., z-direction) perpendicular to the substrate 101 over the channel lower contact layer 105.

In an embodiment, the dielectric structure 20 may be a charge storage structure of a flash memory device. The dielectric structure 20 may include a barrier layer 210, a charge storage layer 220, and a tunneling layer 230. The barrier layer 210 may be disposed on the sidewall surface 10W of the gate structure 10. The barrier layer 210 may contact the first to third gate electrode layers 120a, 120b, and 120c and the metal-organic framework layers 115 of the first to fourth interlayer insulation structures 130a, 130b, 130c, and 130d. The charge storage layer 220 may be disposed on a sidewall surface of the barrier layer 210. The tunneling layer 230 may be disposed on a sidewall surface of the charge storage layer 220. The barrier layer 210, the charge storage layer 220, and the tunneling layer 230 may include oxide, nitride, oxynitride, or a combination of two or more thereof.

Referring to FIGS. 3 and 4 together, the channel layer 240 may be disposed on the sidewall surface 20W of the dielectric structure 20 located inside the hole pattern H1, over the channel lower contact layer 105. The channel layer 240 may be disposed to contact the tunneling layer 230 of the dielectric structure 20. The channel layer 240 may extend in the first direction (i.e., z-direction) perpendicular to the substrate 101 over the channel lower contact layer 105.

The channel layer 240 may include a semiconductor material. The semiconductor material may include, as an example, silicon (Si), germanium (Ge), gallium arsenide (GaAs), or the like. As another example, the semiconductor material may include a two-dimensional (2D) semiconductor material. The 2D semiconductor material may include transition metal dichalcogenide (TMDC), black phosphorus, or the like. The transition metal dichalcogenide may include, for example, molybdenum selenide ($MoSe_2$), hafnium selenide ($HfSe_2$), indium selenide (InSe), gallium selenide (GaSe), or the like. The semiconductor material may include, for example, metal oxide such as indium-gallium-zinc oxide (IGZO). The channel layer 240 may have conductivity. As an example, the conductivity may be caused by doping an n-type or p-type dopant in the semiconductor material.

Referring to FIGS. 3 and 4 together, a filling insulation structure 250 may be disposed inside the hole pattern H1 in which the dielectric structure 20 and the channel layer 240 are disposed. The filling insulation structure 240 may include, for example, oxide, nitride, oxynitride, or a combination of two or more thereof.

Furthermore, inside the hole pattern H1, the channel upper contact layer 260 may be disposed on the filling insulation structure 250. The channel upper contact layer 260 may be electrically connected to the channel layer 240. Although not illustrated, the channel upper contact layer 260 may be electrically connected to a bit line.

The channel upper contact layer 260 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In FIGS. 3 and 4, the channel upper contact layer 260 is illustrated to be disposed inside the hole pattern H1, but the present disclosure is not limited thereto. In some embodiments, the channel upper contact layer 260 may be disposed outside the hole pattern H1. As an example, the channel upper contact layer 260 may be disposed over the hole pattern H1 to be electrically connected to the channel layer 240.

Referring to the circuit diagram U1 of FIG. 5, the semiconductor device 1 may include first to third memory cells MC1, MC2, and MC3 in the form of transistors connected in series between a source line SL and a bit line BL. The semiconductor device 1 may be a NAND-type flash memory device having a string shape.

The first to third memory cells MC1, MC2, and MC3 may include corresponding first to third gate electrodes GL1, GL2, and GL3 and first to third dielectric structures DL1, DL2, and DL3, respectively. The first to third gate electrodes GL1, GL2, and GL3 of FIG. 5 may correspond to the first to third gate electrode layers 120a, 120b, and 120c, respectively, in the semiconductor device 1 of FIGS. 3 and 4. The first to third dielectric structures DL1, DL2, and DL3 of FIG. 5 may correspond to regions of the dielectric structure 20 electrically controlled by the first to third gate electrode layers 120a, 120b, and 120c, respectively, in the semiconductor device 1 of FIGS. 3 and 4.

The function of the metal-organic framework layer 115 of the semiconductor device 1 will be described with reference to FIG. 6. The metal-organic framework layers 115 may constitute the first to fourth interlayer insulation structures 130a, 130b, 130c, and 130d together with the inner insulation layers 110. The metal-organic framework layer 115 may have a low dielectric constant K of 2 or less, as an example. Accordingly, the first to fourth interlayer insulation structures 130a, 130b, 130c, and 130d may effectively reduce parasitic capacitance generated between the first to third gate electrode layers 120a, 120b, and 120c. As a result, the RC delay phenomenon caused by the parasitic capacitance can be alleviated.

In addition, in consideration of the low dielectric constant of the metal-organic framework layer 115 described above in advance, the heights of the first to fourth interlayer insulation structures 130a, 130b, 130c, and 130d which are disposed between the first to third gate electrode layers 120a, 120b, and 120c may be reduced. Accordingly, the number of the stacked memory cells in the z-direction may be increased by the reduced heights of the first to fourth interlayer insulation structures 130a, 130b, 130c, and 130d. As a result, the degree of integration of the memory cells of the semiconductor device 1 can be improved.

Furthermore, the metal-organic framework layers 115 may effectively control electrical signal interference among the gate electrode layers 120a, 120b, and 120c. As an embodiment, the signal interference control effect of the metal-organic framework layers 115 will be described with reference to FIG. 6 in a case in which a program operation or an erase operation is performed on the second memory cell MC2 having the second gate electrode layer 120b.

First, a channel voltage may be applied between the channel lower contact layer 105 and the channel upper contact layer 260, so that electrons may be conducted along the z-direction in the channel layer 240. Subsequently, a program voltage having a positive polarity or an erase voltage having a negative polarity may be applied to the second gate electrode layer 120b to form an electric field between the second gate electrode layer 120b and the channel layer 240. The electric field may include fringing electric fields E2 and E3 formed by bypassing the outside of operation regions, in addition to a program electric field E1 acting on the operation regions belonging to the second memory cell MC2, for example, a portion 210B of the barrier layer 210, a portion 220B of the charge storage layer 220, a portion 230B of the tunneling layer 230, and a portion 240B of the channel layer 240. In this case, the fringing electric field E2 may exert an electric attraction force or a repulsion force on charges stored in the portion 220C of the charge storage layer 220 of the third memory cell MC3 electrically controlled by the third gate electrode layer 120c. As a result, the amount of the charges stored in the portion 220C of the charge storage layer 220 of the third memory cell MC3 may be changed. In addition, the fringing electric field E3 may exert an electric attraction force or a repulsion force on charges stored in the portion 220A of the charge storage layer 220 of the first memory cell MC1 electrically controlled by the first gate electrode layer 120a. As a result, the amount of the charges stored in the portion 220A of the charge storage layer 220 of the first memory cell MC1 may be changed. The fringing electric fields E2 and E3 may change signal information stored in the first and third memory cells MC1 and MC3.

Meanwhile, the fringing electric filed may be generated by the gate voltage applied to the first gate electrode layer 120a of the first memory cell MC1 or the third gate electrode layer 120c of the third memory cell MC3. The fringing electric field may change the amount of the charges stored in the portion 220B of the charge storage layer 220 of the second memory cell MC2. Accordingly, signal information stored in the second memory cell MC2 may be changed.

According to an embodiment of the present disclosure, the metal-organic framework layers 115 of the first to fourth interlayer insulation structures 130a, 130b, 130c, and 130d may include cavities therein. The cavities may weaken or suppress the fringing electric field passing through the metal-organic framework layers 115. Accordingly, deterioration of signal information of a memory cell generated by the fringing electric field can be reduced, and reliability of the signal information can be improved.

Figure 7:
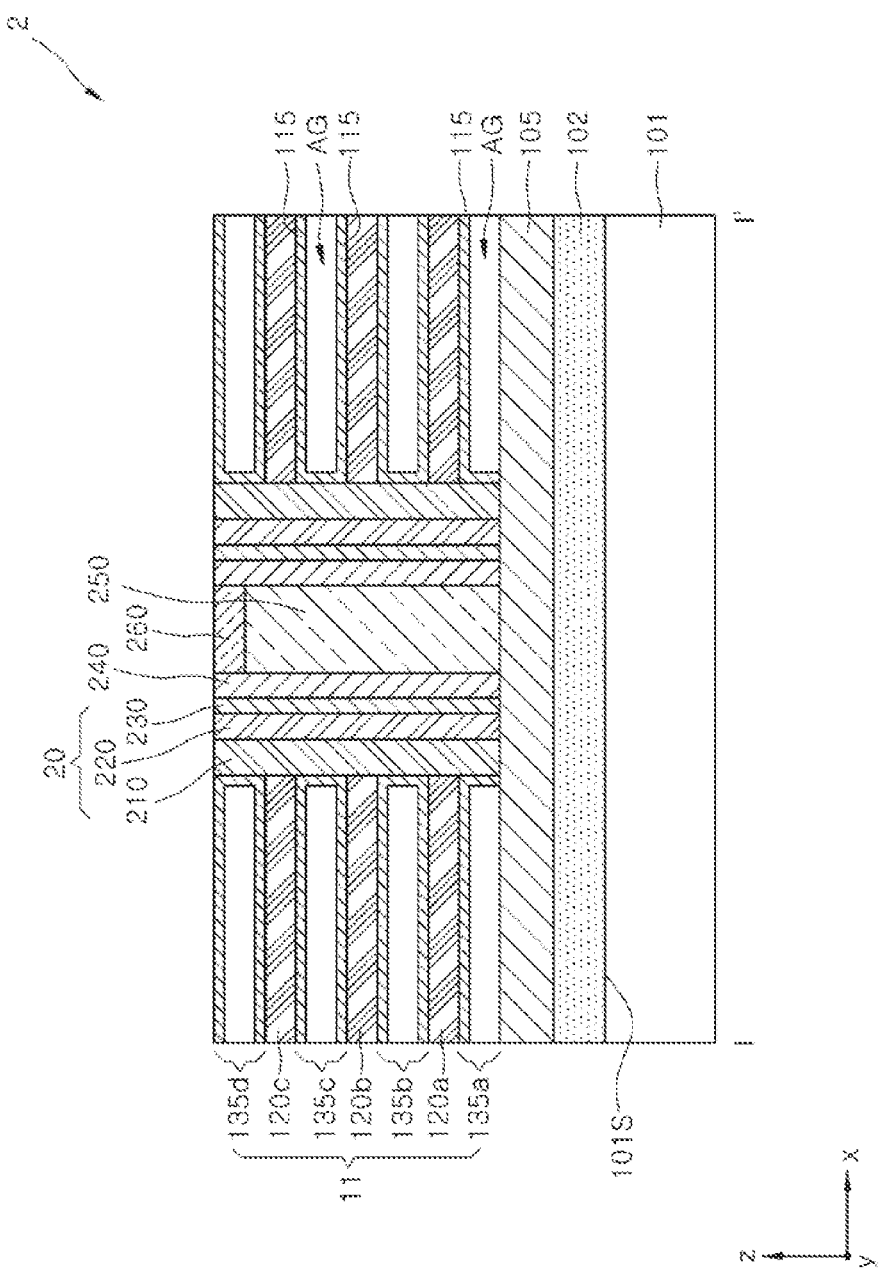
FIG. 7 is a cross-sectional view schematically illustrating an electronic device according to another embodiment of the present disclosure.

FIG. 7 is a cross-sectional view schematically illustrating a semiconductor device 2 according to another embodiment of the present disclosure. The semiconductor device 2 of FIG. 7 differs in a configuration of a gate structure 11 compared to the semiconductor device 1 described above with reference to FIGS. 3 and 4.

Referring to FIG. 7, the gate structure 11 may include first to third gate electrode layers 120a, 120b, and 120c and first to fourth interlayer insulation structures 135a, 135b, 135c, and 135d which are alternately stacked over a channel lower contact layer 105.

The first to fourth interlayer insulation structures 135a, 135b, 135c, and 135d may include a metal-organic framework layer 115 and an air gap AG. In an embodiment, the air gaps AG may be formed by removing the inner insulation layers 110 of the first to fourth interlayer insulation structures 130a, 130b, 130c, and 130d in the semiconductor device 1 of FIGS. 3 and 4. Accordingly, in the semiconductor device 2 of FIG. 7, the metal-organic framework layers 115 of the first to fourth interlayer insulation structures 135a, 135b, 135c, and 135d may be disposed to surround the air gaps AG. In an embodiment, the air gaps AG may include gases found in air. In another embodiment, the air gaps AG may include other gases besides the gases found in the air. For example, the air gaps AG may include any gas provided for semiconductor processes and any gas formed from the semiconductor processes.

The first to fourth interlayer insulation structures 135a, 135b, 135c, and 135d include the air gaps AG, so that the permittivity of the first to fourth interlayer insulating structures 135a, 135b, 135c, and 135d may be further reduced compared to the first to fourth interlayer insulating structures 130a, 130b, 130c, and 130d of the semiconductor device 1 of FIGS. 3 and 4. As a result, the parasitic capacitance between the plurality of gate electrode layers 120a, 120b, and 120c may be further reduced, so that the RC delay phenomenon can be further improved.

Figure 8:
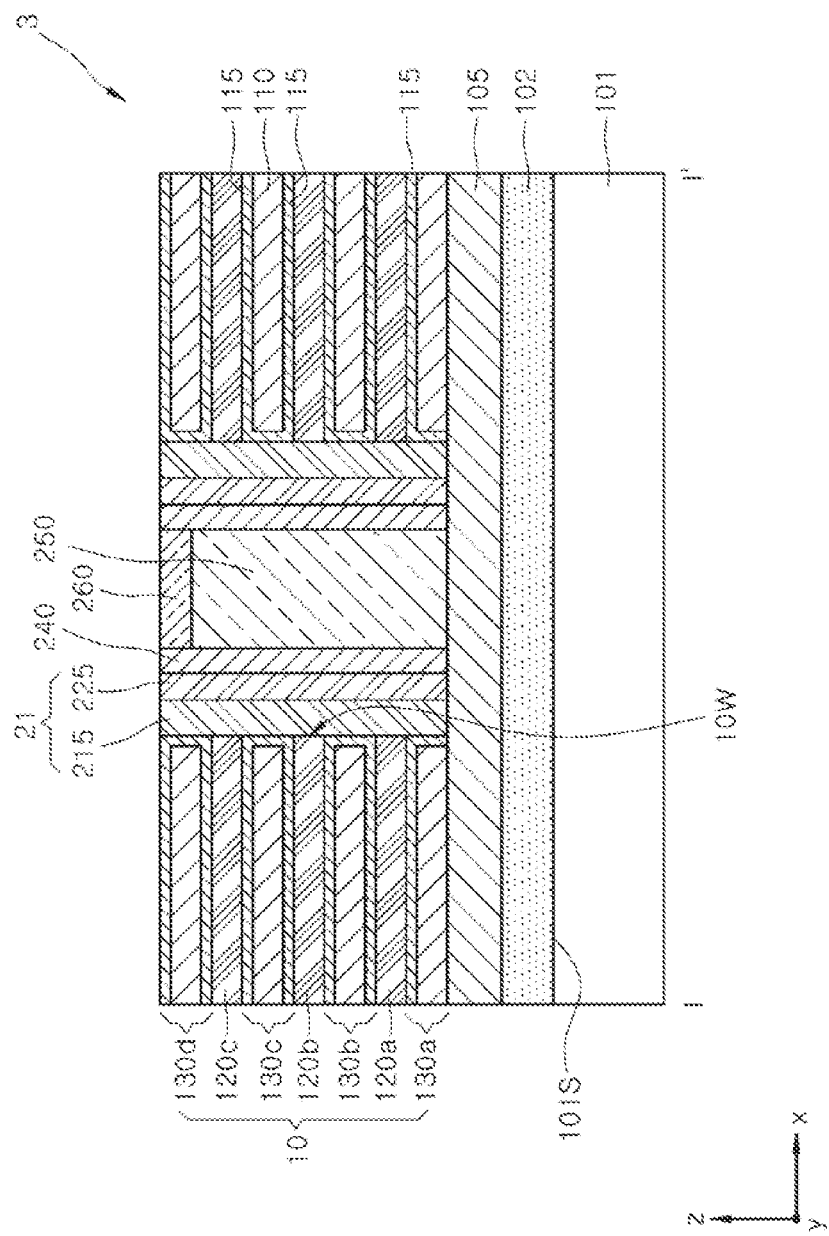
FIG. 8 is a cross-sectional view schematically illustrating an electronic device according to yet another embodiment of the present disclosure.
Figure 9:
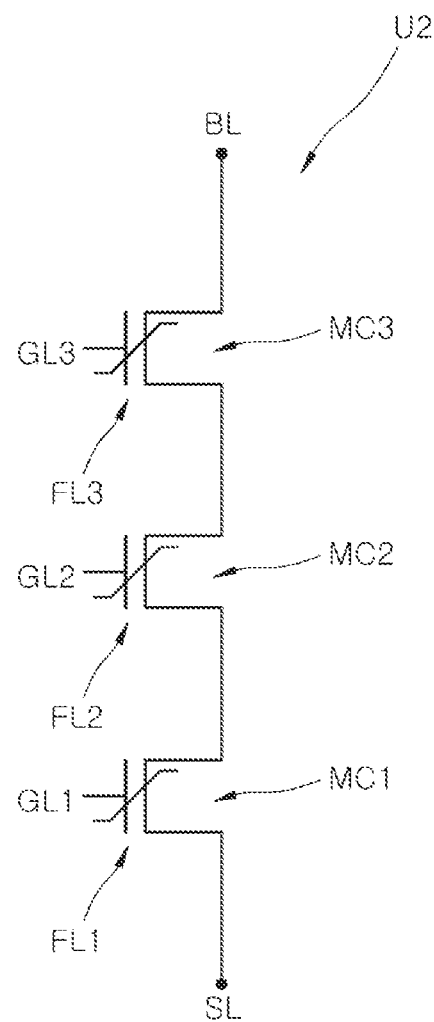
FIG. 9 is an electric circuit diagram of the semiconductor device of FIG. 8.

FIG. 8 is a cross-sectional view schematically illustrating a semiconductor device 3 according to yet another embodiment of the present disclosure. FIG. 9 is a schematic electric circuit diagram of the semiconductor device 3 of FIG. 8. The semiconductor device 3 of FIG. 8 differs in a configuration of a dielectric structure 21 compared to the semiconductor device 1 described above with reference to FIGS. 3 and 4.

Referring to FIG. 8, the dielectric structure 21 of the semiconductor device 3 may include a ferroelectric memory layer 215 disposed on a sidewall surface 10W of a gate structure 10, and an interfacial insulation layer 225 disposed on a sidewall surface of the ferroelectric memory layer 215, over a channel lower contact layer 105.

The ferroelectric memory layer 215 may include a ferroelectric material. The ferroelectric material may include, for example, a binary metal oxide such as hafnium oxide, zirconium oxide, or the like. As another example, the ferroelectric material may include a perovskite-based material such as lead zirconate titanate (PZT), strontium bismuth titanate (SBT), or the like.

The interfacial insulation layer 225 may include, for example, oxide, nitride, oxynitride, or the like. Specifically, the interfacial insulation layer 225 may include silicon oxide, silicon nitride, silicon oxynitride, aluminum oxide, aluminum nitride, or the like.

Referring to the circuit diagram U2 of FIG. 9, the semiconductor device 3 may include first to third memory cells MC1, MC2, and MC3 in the form of transistors connected in series between a source line SL and a bit line BL.

The first to third memory cells MC1, MC2, and MC3 may include corresponding first to third gate electrodes GL1, GL2, and GL3 and first to third ferroelectric memory elements FL1, FL2, and FL3, respectively. The first to third ferroelectric memory elements FL1, FL2, and FL3 may have memory characteristics capable of non-volatilely storing electrical polarization. The first to third gate electrodes GL1, GL2, and GL3 may correspond to the first to third gate electrode layers 120a, 120b, and 120c, respectively, in the semiconductor device 3 of FIG. 8. The first to third ferroelectric memory elements FL1, FL2, and FL3 may correspond to the portions of the ferroelectric memory layer 215 which are electrically controlled by the first to third gate electrode layers 120a, 120b, and 120c, respectively, in the semiconductor device 3 of FIG. 8.

Referring to FIG. 8 again, the first to fourth interlayer insulation structures 130a, 130b, 130c, and 130d may include a metal-organic framework layer 115 having a cavity. When a voltage is applied between the gate electrode layers 120a, 120b, and 120c and the channel layer 240, the cavities may weaken or suppress a fringing electric field passing through the metal-organic structure layers 115. Accordingly, it is possible to prevent or mitigate changes in electrical polarization as signal information stored in the ferroelectric layer portion of a target memory cell by the fringing electric field. Accordingly, it may be possible to improve the reliability of signal information stored in the memory cell.

Figure 10:
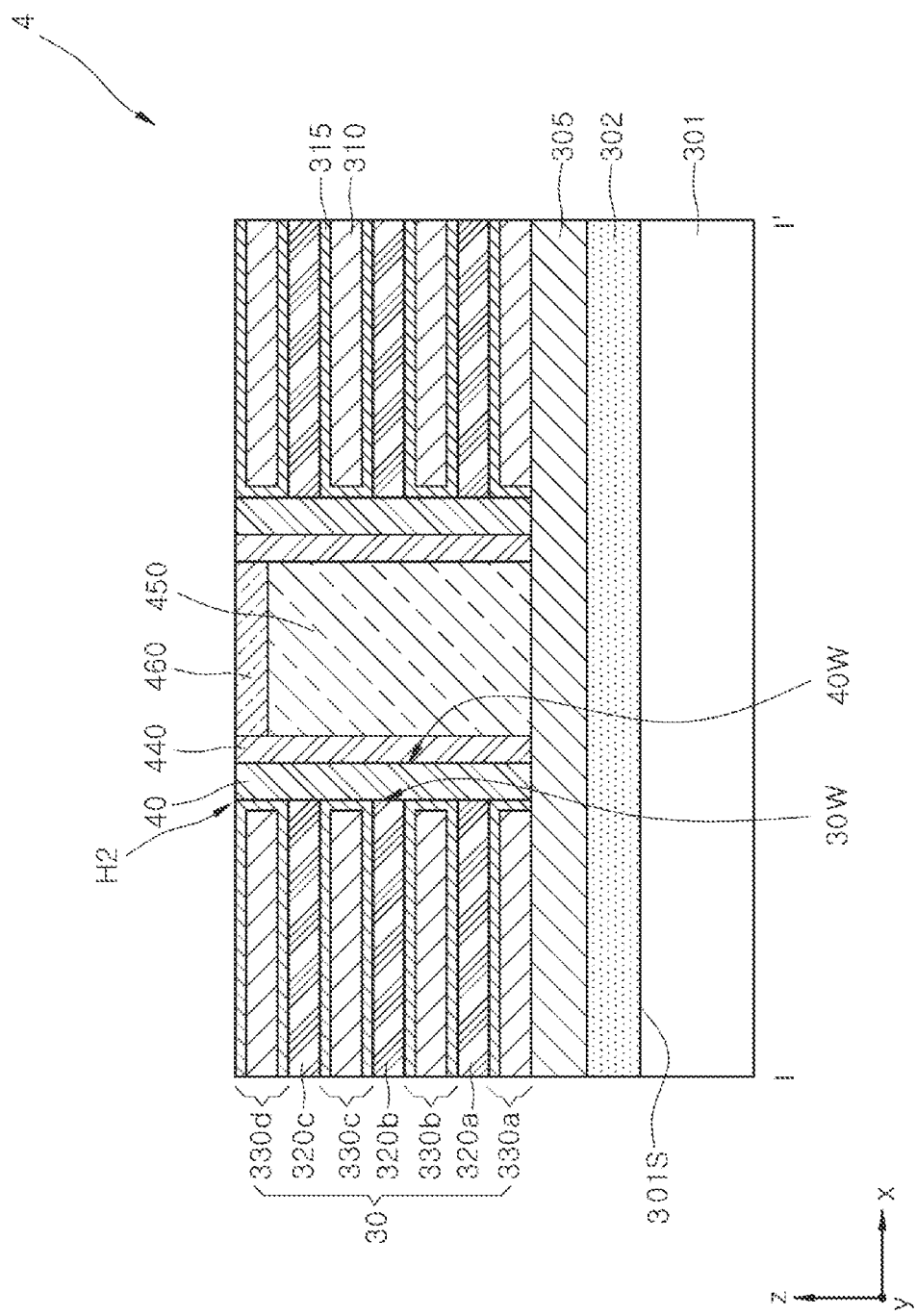
FIG. 10 is a cross-sectional view schematically illustrating an electronic device according to yet another embodiment of the present disclosure.

FIG. 10 is a cross-sectional view schematically illustrating a semiconductor device 4 according to yet another embodiment of the present disclosure. The semiconductor device 4 may include a substrate 301, an electrode structure 30 and a dielectric structure 40 disposed over the substrate 301. In addition, the semiconductor device 4 may include a vertical electrode layer 440 disposed on a sidewall surface 40W of the dielectric structure 40 over the substrate 301.

Referring to FIG. 10, the substrate 301 may be provided. A base insulation layer 302 may be disposed on the substrate 301. A lower conduction layer 305 may be disposed on the base insulation layer 302. The configurations of the substrate 301 and the base insulation layer 302 of the semiconductor device 4 may be substantially the same as the configurations of the substrate 101 and the base insulation layer 102 of the semiconductor device 1 described above in connection with FIGS. 3 and 4. The lower conduction layer 305 may include a conductive material. In an embodiment, the lower conduction layer 305 may be electrically connected to a source line. The lower conduction layer 305 may be made of substantially the same material as the channel lower contact layer 105 of the semiconductor device 1 described with reference to FIGS. 3 and 4. The lower conduction layer 305 may be electrically connected to the vertical electrode layer 440.

The electrode structure 30 may be disposed on the lower conduction layer 305. The electrode structure 30 may include first to third horizontal electrode layers 320a, 320b, and 320c and first to fourth interlayer insulation structures 330a, 330b, 330c, and 330d which are alternately stacked with each other. The first to third horizontal electrode layers 320a, 320b, and 320c may be disposed on surfaces substantially parallel to a surface 301S of the substrate 301. Similarly, the first to fourth interlayer insulation structures 330a, 330b, 330c, and 330d may be disposed on surfaces substantially parallel to the surface 301S of the substrate 301.

The first to third horizontal electrode layers 320a, 320b, and 320c may include a conductive material. In an embodiment, the first to third horizontal electrode layers 320a, 320b, and 320c may be made of substantially the same material and may have substantially the same structure as the first to third gate electrode layers 120a, 120b, and 120c described with reference to FIGS. 3 and 4. The first to fourth interlayer insulation structures 330a, 330b, 330c, and 330d may be substantially the same as the first to fourth interlayer insulation structures 130a, 130b, 130c, and 130d described with reference to FIGS. 3 and 4. That is, the first to fourth interlayer insulation structures 330a, 330b, 330c, and 330d may include an inner insulation layer 310 and a metal-organic framework layer 315. The inner insulation layers 310 and the metal-organic framework layers 315 may be substantially the same as the inner insulation layers 110 and the metal-organic framework layers 115 described with reference to FIGS. 3 and 4.

Referring to FIG. 10, the electrode structure 30 may include a hole pattern H2. The hole pattern H2 may penetrate the electrode structure 30 to expose the lower conduction layer 305. In addition, the hole pattern H2 may expose a sidewall surface 30W of the electrode structure 30.

The dielectric structure 40 may be disposed to contact the sidewall surface 30W of the electrode structure 30 located inside the hole pattern H2, over the lower conduction layer 305. The dielectric structure 40 may include a variable resistance layer including a resistance change material. The resistance change material may mean a material having an internal electrical resistance that changes by a stimulus such as a voltage or current applied from the outside, for example. In addition, the resistance change material may non-volatilely store the changed electrical resistance after the external stimulus is removed. The dielectric structure 40 may include a single variable resistance layer or two or more variable resistance layers.

The variable resistance layer may include metal oxide including oxygen vacancies or movable metal ions as the resistance change material. In an embodiment, the electrical resistance of the metal oxide may vary according to the concentration and distribution state of the oxygen vacancies or the movable metal ions. The metal oxide may include, for example, lithium oxide, titanium oxide, nickel oxide, copper oxide, manganese oxide, hafnium oxide, zirconium oxide, tungsten oxide, niobium oxide, vanadium oxide, or a combination of two or more thereof.

Referring to FIG. 10, the vertical electrode layer 440 may be disposed on a sidewall surface 40W of the dielectric structure 40 on the lower conduction layer 305. The vertical electrode layer 440 may extend in a direction substantially perpendicular to the surface 301S of the substrate 301. The vertical electrode layer 440 may include a conductive material. The vertical electrode layer 440 may be made of substantially the same material as the first to third horizontal electrode layers 330a, 330b, and 330c.

A filling insulation structure 450 may be disposed inside the hole pattern H2 in which the dielectric structure 40 and the vertical electrode layer 440 are disposed. The filling insulation structure 450 may include, for example, oxide, nitride, oxynitride, or a combination of two or more thereof.

In addition, inside the hole pattern H2, an upper conduction layer 460 may be disposed on the filling insulation structure 450. The upper conduction layer 460 may be electrically connected to the vertical electrode layer 440. Although not illustrated, the upper conduction layer 460 may be electrically connected to a bit line. The upper conduction layer 460 may include a conductive material. The upper conduction layer 460 may be made of substantially the same material as the channel upper contact layer 260 of the semiconductor device 1 described with reference to FIGS. 3 and 4.

In some embodiments apart from that shown in FIG. 10, air gaps may be disposed in place of the inner material layers 310. Accordingly, the first to fourth interlayer insulation structures 330a, 330b, 330c, and 330d may include the metal-organic framework layers 315 and the air gaps. The configurations of the first to fourth interlayer insulation structures 330a, 330b, 330c, 330d including the air gaps and the metal-organic structure layers 315 may be substantially the same as the configurations of the first to fourth interlayer insulation structures 135a, 135b, 135c, and 135d of the semiconductor device 2 described above with reference to FIG. 7.

In this embodiment, when an operating voltage is applied between the horizontal electrode layer 440 selected from the first to third horizontal electrode layers 320a, 320b, and 320c and the vertical electrode layer 440, the electrical resistance inside the dielectric structure 40 controlled by the operating voltage may be changed. The changed electrical resistance may be stored as signal information of a memory cell. In FIG. 10, there may be provided first to third memory cells respectively disposed between the first to third horizontal electrode layers 320a, 320b, and 320c and the vertical electrode layer 440.

In this embodiment, the first to fourth interlayer insulation structures 330a, 330b, 330c, and 330d including the metal-organic structure layers 315 may effectively reduce the parasitic capacitance generated among the first to third horizontal electrode layers 320a, 320b, and 320c. In addition, the cavities of the metal-organic structure layers 315 may effectively control the fringing electric fields between the first to third horizontal electrode layers 320a, 320b, and 320c and the vertical electrode layer 440. Accordingly, it may be possible to improve deterioration of electrical resistance stored in the variable resistance layer of the memory cell due to the fringing electric field. As a result, reliability of the signal information stored in the memory cell can be improved.

FIGS. 11 to 17 are cross-sectional views schematically illustrating a method of manufacturing a semiconductor device according to an embodiment of the present disclosure. The method to be described with reference to FIGS. 11 to 17 may be applied to methods of manufacturing the semiconductor device 1 of FIGS. 3 and 4, the semiconductor device 3 of FIG. 8, and the semiconductor device 4 of FIG. 10.

Figure 11:
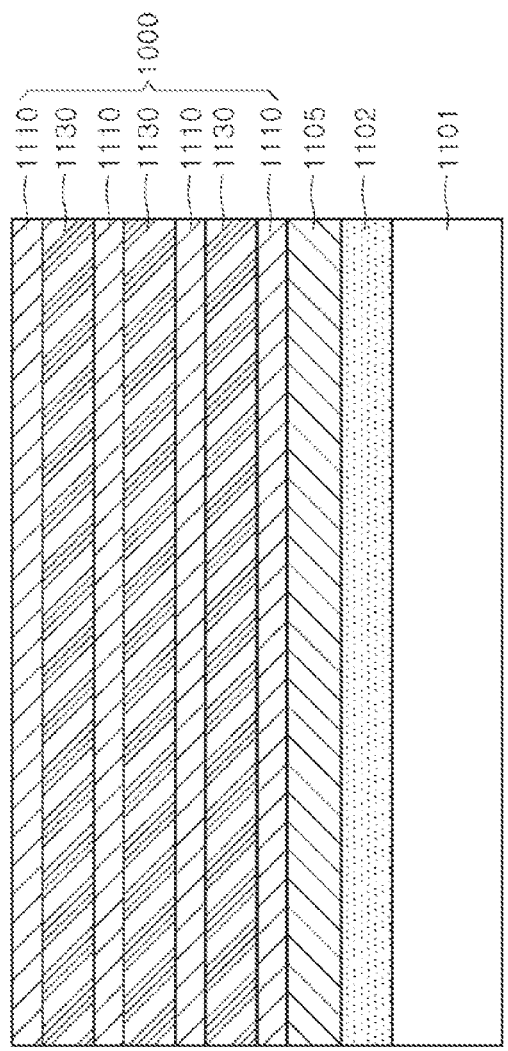
FIGS. 11, 12, 13, 14, 15, 16, and 17 are cross-sectional views schematically illustrating a method of manufacturing a semiconductor device according to an embodiment of the present disclosure.

Referring to FIG. 11, a substrate 1101 including a base insulation layer 1102 may be prepared. The substrate 1101 and the base insulation layer 1102 may be substantially the same as the substrate 101 and the base insulation layer 102 of the semiconductor device 1 described with reference to FIGS. 3 and 4.

A lower conduction layer 1105 may be formed on the base insulation layer 1102. The lower conduction layer 1105 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The lower conduction layer 1105 may be formed by using, for example, a chemical vapor deposition method, a physical vapor deposition method, an atomic layer deposition method, or the like.

A stack structure 1000 may be formed on the lower conduction layer 1105. The stack structure 1000 may include a plurality of insulating material layers 1110 and a plurality of sacrificial material layers 1130 which are alternately stacked each other. The insulating material layers 1110 may be formed at a lowermost layer and an uppermost layer of the stack structure 1000.

The insulating material layers 1110 and the sacrificial material layers 1130 may have etching selectivity each other. The insulating material layers 1110 may include, for example, oxide, nitride, oxynitride, or a combination of two or more thereof. The sacrificial material layers 1130 may include, for example, a material selected to have etching selectivity with the insulating material layer 1110 from among oxide, nitride, oxynitride, silicon (Si), or a combination of two or more thereof.

Figure 12:
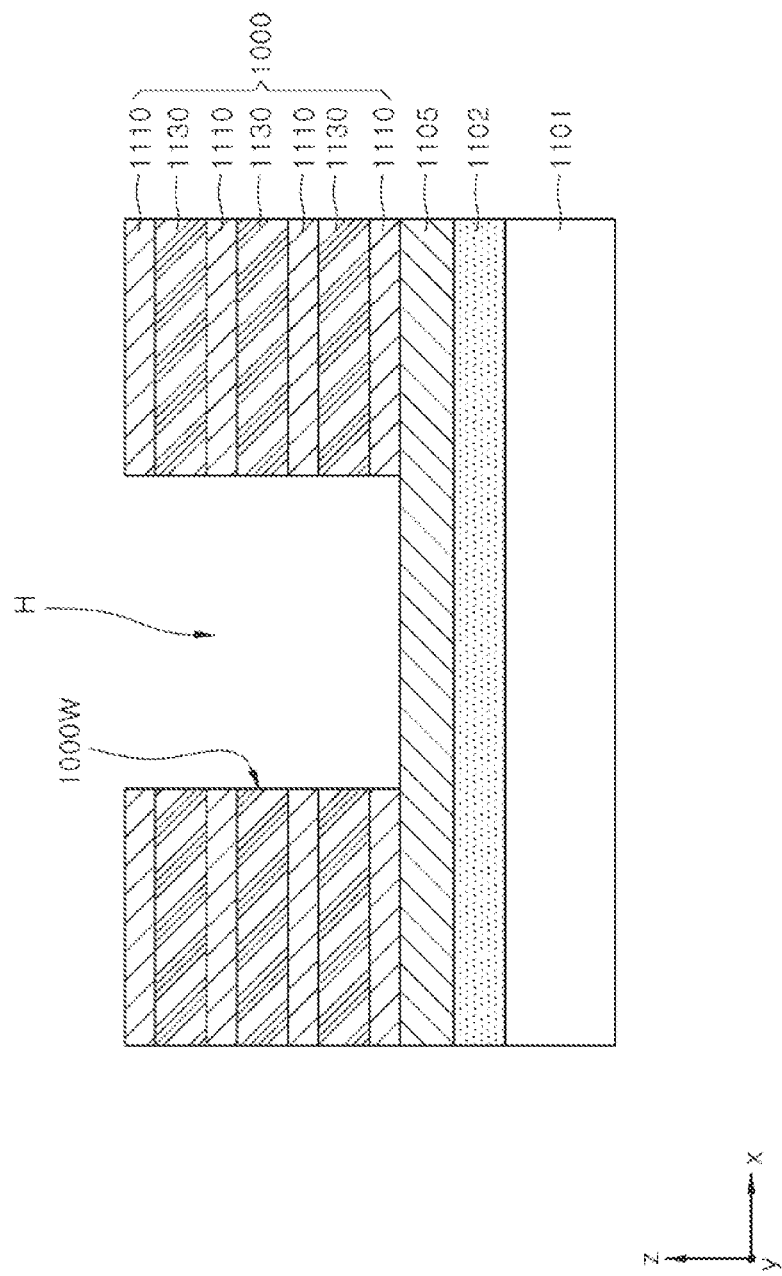

Referring to FIG. 12, the stack structure 1000 may be selectively etched to form a hole pattern H on the lower conduction layer 1105. A sidewall surface 1000W of the stack structure 1000 may be exposed through the hole pattern H. In addition, the lower conduction layer 1105 may be exposed through the hole pattern H. The etching for the stack structure 1000 may be performed by a photolithography process and an anisotropic etching process. As an example, as the anisotropic etching process, a dry etching method using a plasma may be applied.

Figure 13:
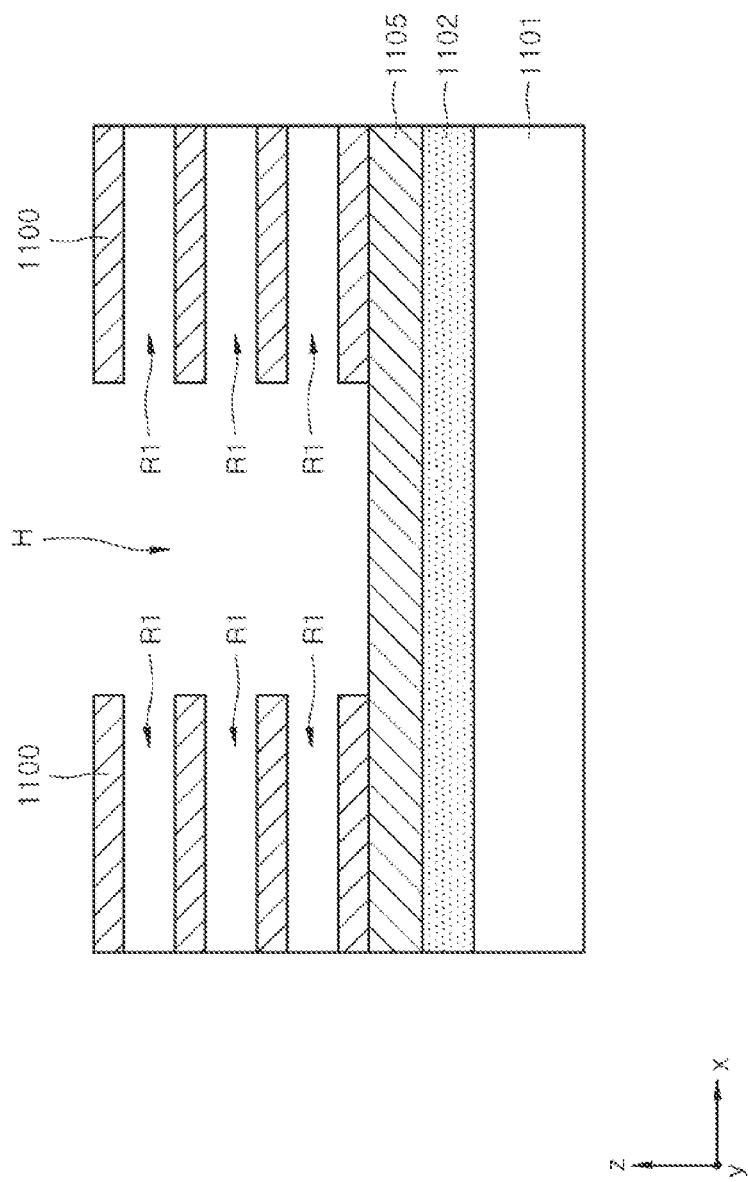

Referring to FIG. 13, the sacrificial material layers (1130 of FIG. 12) may be removed through the exposed sidewall surface 1000W of the stack structure 1000 of FIG. 12 to form recess spaces R1. The sacrificial material layers may be removed through an anisotropic etching process. In an embodiment, the sacrificial material layers may be removed by wet etching the sacrificial material layers 1130 by providing an etchant having etching selectivity to the insulating material layer 1110 into the hole pattern H. In this case, the etchant might not etch the lower conduction layer 1105.

Figure 14:
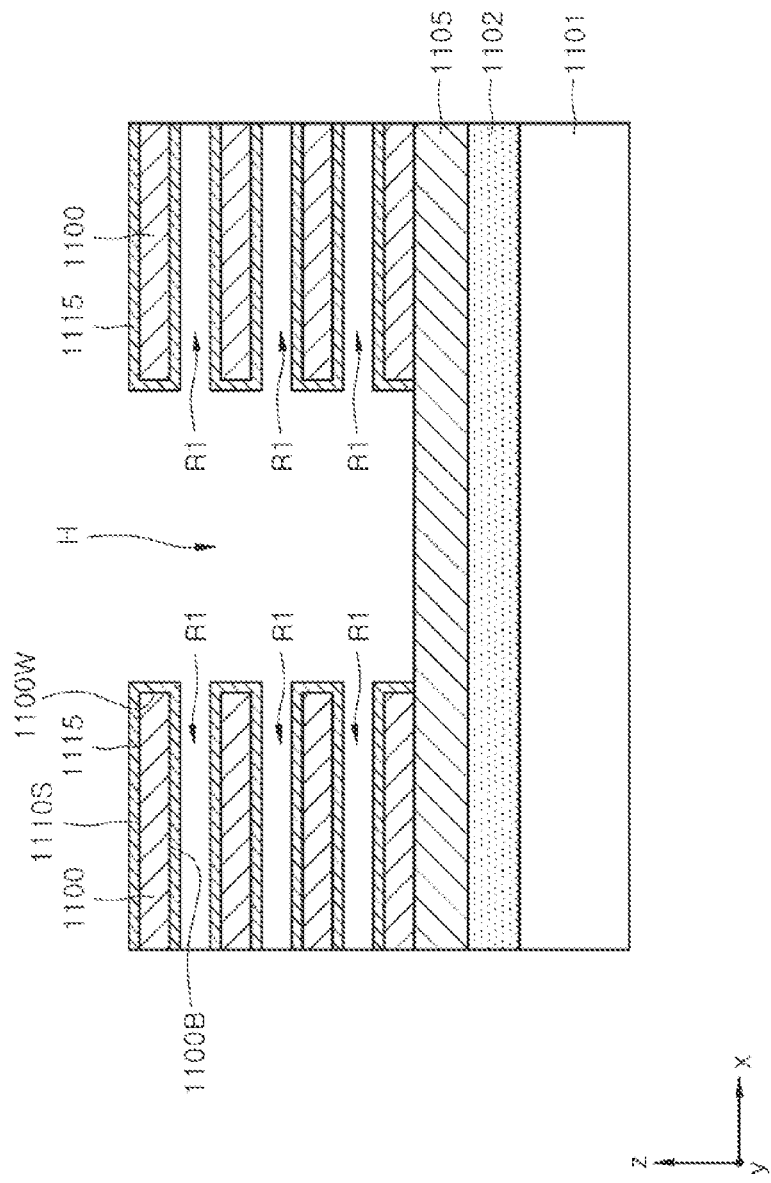

Referring to FIG. 14, metal-organic framework layers 1115 may be formed on the insulating material layer 1110. The metal-organic framework layers 1115 may each have a form in which a plurality of sheet-type metal-organic frameworks (M1, M2, M3, and M4 of FIG. 2) are stacked in a thickness direction, as described above in connection with FIG. 2. The plurality of metal-organic frameworks M1, M2, M3, and M4 may be bonded to each other by a van der Waals force, thereby forming a thin film.

The plurality of metal-organic frameworks M1, M2, M3, and M4 may be a material formed by coordinating a node containing a metal and an organic ligand as shown in FIG. 1. The node including a metal may be, for example, a metal ion or a metal cluster. The metal constituting the node may include, for example, zinc (Zn), chromium (Cr), indium (In), gallium (Ga), copper (Cu), iron (Fe), molybdenum (Mo), cobalt (Co), ruthenium (Ru), manganese (Mn), Lanthanum (La), titanium (Ti), hafnium (Hf), cadmium (Cd), zirconium (Zr), or the like. The organic ligand may include, for example, oxalic acid, fumaric acid, benzenehexathiol, triphenylenehexathiol), 1,4-benzene dicarboxylic acid, hexaaminobenzene, tetrakis(4-carboxyphenyl)-porphyrinato-cobalt (II), tetrakis(4-carboxyphenyl)-porphyrin, or the like. The organic ligand may include, as another example, $H_2BDC$, $H_2BDC$-Br, $H_2BDC$-OH, $H_2BDC$-NO2, $H_2BDC$-$NH_2$, $H_4DOT$, $H_2BDC$-$(Me)_2$, $H_2BDC$-$(Cl)_2$, or the like.

In an embodiment, the metal-organic framework layers 1115 may be formed by using an atomic layer deposition method. The metal-organic framework layers 1115 may be formed by stacking two-dimensional sheet-type metal-organic frameworks including cavities or three-dimensional metal-organic frameworks including cavities. In the atomic layer deposition method, for example, trimethylaluminum (AlMe3) or dimethylaluminum iso-propoxide ([Al—$Me_2{}^iOPr]_2$) may be used as a precursor.

Referring to FIG. 14, the metal-organic framework layers 1115 may be formed to surround the insulating material layers 1110. That is, the metal-organic framework layers 1115 may be formed on an upper surface 1110S, a sidewall surface 1110W, and a lower surface 1110B of the insulating material layers 1110. In a case of the lowermost insulating material layer 1110 in contact with the lower conduction layer 1105, the metal-organic framework layer 1115 may be formed on the upper surface 1110S and the sidewall surface 1110W of the lowermost insulating material layer 1110.

Figure 15:
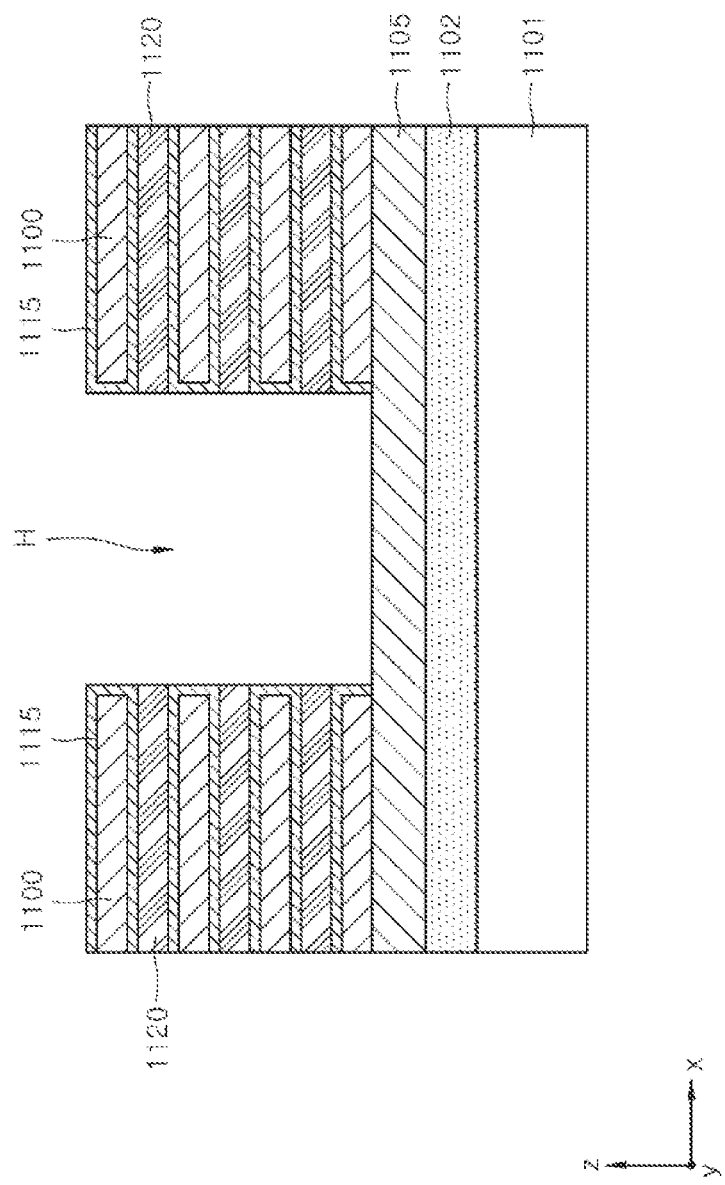

Referring to FIG. 15, the recess spaces R1 of FIG. 14 may be filled with a conductive material to form first conduction layers 1120. In this case, the first conduction layers 1120 may contact the metal-organic framework layers 1115 in the z-direction. In an embodiment, the first conduction layers 1120 may be formed, for example, by depositing a conductive material layer using a chemical vapor deposition method, an atomic layer deposition method, or the like. In this case, the process of forming the first conduction layers 1120 may include a process of filling at least the recess spaces R1 with the conductive material layer, and a process of performing anisotropic etching to remove the conductive material layer formed in the hole pattern H1 outside the recess spaces R1.

Figure 16:
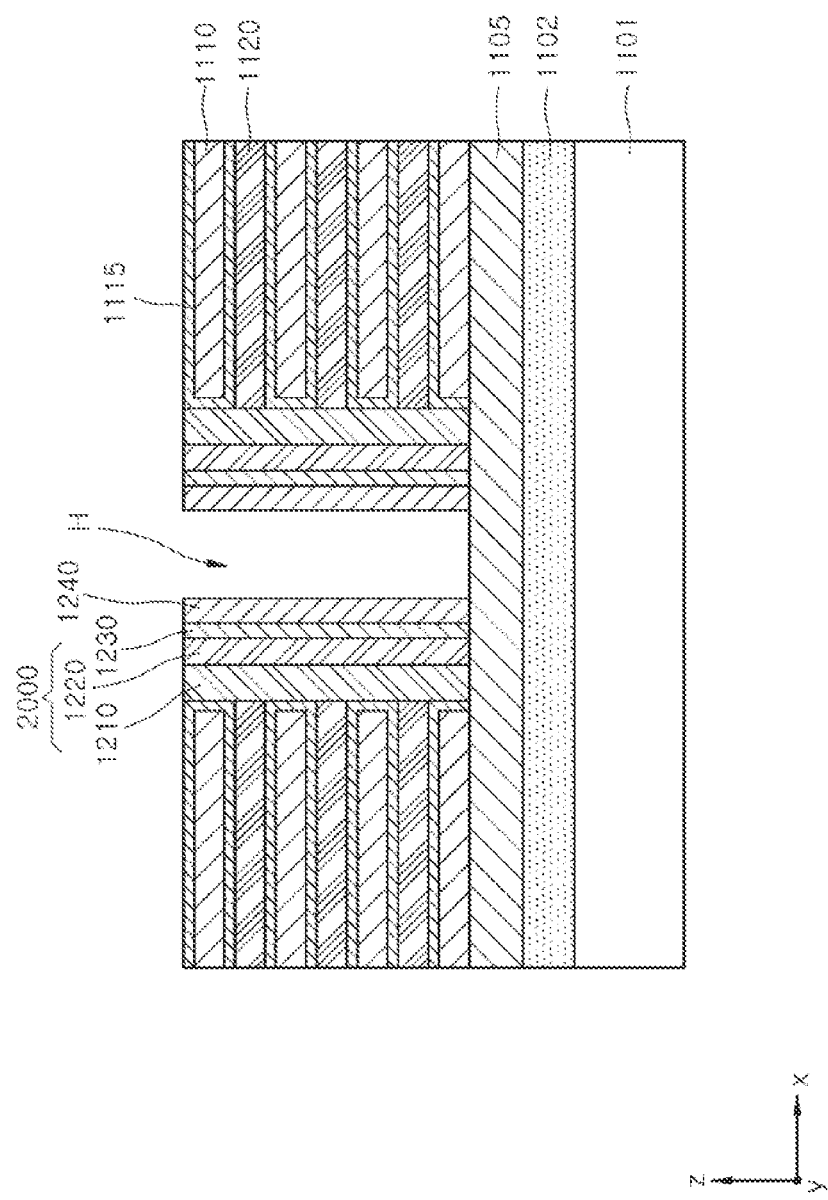

Referring to FIG. 16, a dielectric structure 2000 may be formed to contact the metal-organic framework layers 1115 and the first conduction layers 1120 in the hole pattern H. The process of forming the dielectric structure 2000 may include forming a first dielectric layer 1210 on sidewall surfaces of the metal-organic framework layers 1115 and the first conduction layers 1120 in the hole pattern H, forming a second dielectric layer 1220 on a sidewall surface of the first dielectric layers 1210, and forming a third dielectric layer 1230 on a sidewall surface of the second dielectric layer 1220.

The process of forming the first to third dielectric layers 1210, 1220, and 1230 may include depositing dielectric thin films corresponding to the first to third dielectric layers 1210, 1220, and 1230, and patterning the deposited dielectric thin films to be disposed on planes parallel to the z-direction. The dielectric thin films may be deposited by, for example, a chemical vapor deposition method, an atomic layer deposition method, a sputtering method, or the like. The dielectric thin films may be patterned by, for example, an anisotropic etching method using a plasma.

In an embodiment, the first to third dielectric layers 1210, 1220, and 1230 may correspond to the barrier layer 210, the charge storage layer 220, and the tunneling layer 230 of the dielectric structure 20, respectively, described in connection with FIGS. 3 and 4. In another embodiment, the first dielectric layer 1210 and the second dielectric layer 1220 may correspond to the ferroelectric layer 215 and the interfacial insulation layer 225 of the dielectric structure 21, respectively, described in connection with FIG. 8. In this case, the third dielectric layer 1230 may be omitted. In yet another embodiment, the first to third dielectric layers 1210, 1220, and 1230 may constitute the dielectric structure 40 described in connection with FIG. 10. Accordingly, at least one of the first to third dielectric layers 1210, 1220, and 1230 may be the variable resistance layer including a resistance change material. When the dielectric structure 40 is composed of a single variable resistance layer, only one of the first to third dielectric layers 1210, 1220, and 1230 may be formed, and the remaining dielectric layers may be omitted.

Referring to FIG. 16, a second conduction layer 1240 may be formed to contact the dielectric structure 2000 on the lower conduction layer 1105. The second conduction layer 1240 may include a conductive material. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The process of forming the second conduction layer 1240 may include depositing a conductive material layer inside the hole pattern H and patterning the deposited conductive material layer to be disposed on planes parallel to the z-direction. The conductive material layer may be deposited by, for example, a chemical vapor deposition method, an atomic layer deposition method, a sputtering method, or the like. The conductive material layer may be patterned by, for example, an anisotropic etching method using a plasma.

Figure 17:
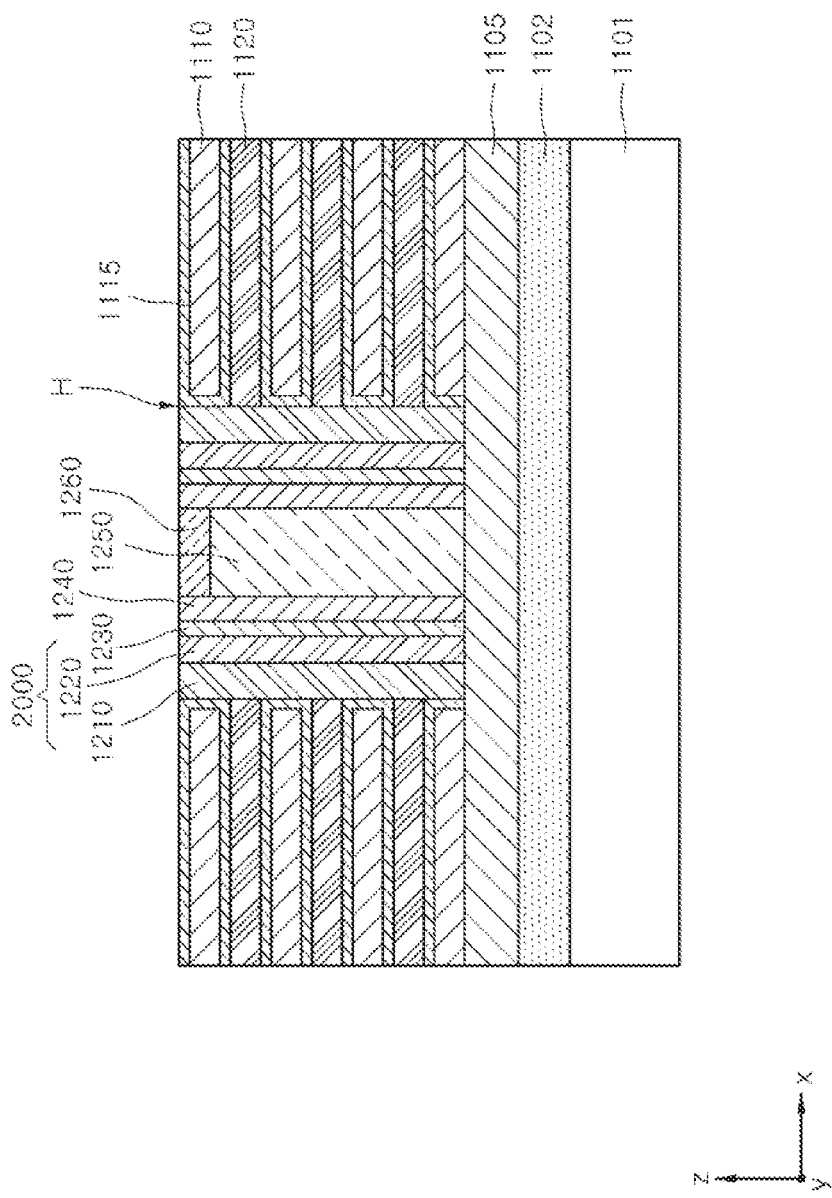

Referring to FIG. 17, the hole pattern H in which the dielectric structure 2000 and the second conduction layer 1240 are formed may be filled with an insulating material to form a filling insulation structure 1250. The filling insulation structure 1250 may include, for example, oxide, nitride, oxynitride, or a combination of two or more thereof. As an example, the filling insulation structure 1250 may be formed by applying a chemical vapor deposition method, a coating method, a sputtering method, or the like.

Subsequently, an upper portion of the filling insulation structure 1250 may be removed, and a side surface of the second conduction layer 1240 may be exposed. Subsequently, an upper conduction layer 1260 may be formed to contact the exposed side surface of the second conduction layer 1240. The upper conduction layer 1260 may include a conductive material. As an example, the upper conduction layer 1260 may be made of substantially the same material as the lower conduction layer 1150. The upper conduction layer 1260 may be formed by, for example, using a chemical vapor deposition method, an atomic layer deposition method, or the like. A semiconductor device according to an embodiment of the present disclosure may be manufactured through the above-described processes.

Figure 18:
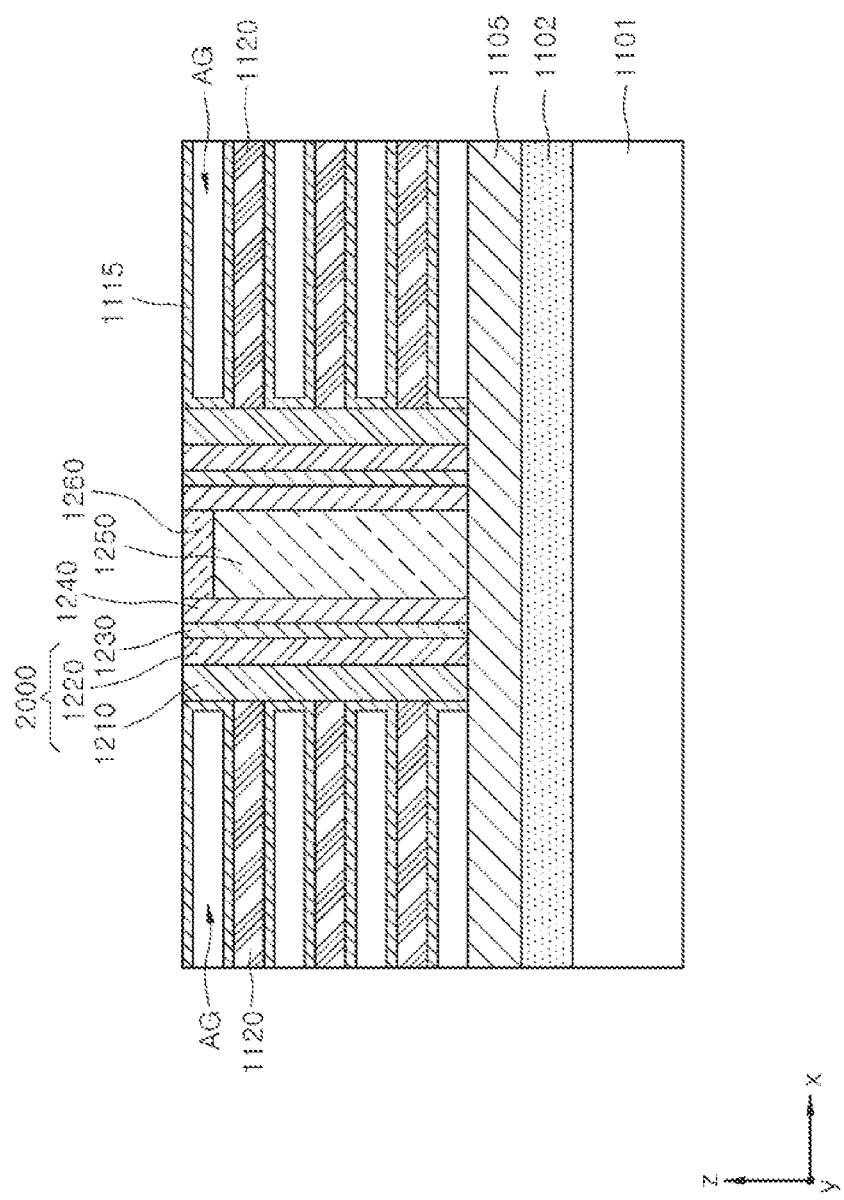
FIG. 18 is a cross-sectional view schematically illustrating a method of manufacturing a semiconductor device according to another embodiment of the present disclosure.

FIG. 18 is a cross-sectional view schematically illustrating a method of manufacturing a semiconductor device according to another embodiment of the present disclosure. The manufacturing method to be described with reference to FIG. 18 may be applied to the manufacturing method of the semiconductor device 2 of FIG. 7.

The method of manufacturing the semiconductor device related to FIG. 18 may be continuously performed after the method of manufacturing the semiconductor device described with reference to FIGS. 10 to 17 is performed. Referring to FIG. 18, in the structure of the semiconductor device of FIG. 17, the insulating material layer 1110 may be selectively etched to form air gaps AG.

In an embodiment, the process of forming the air gaps AG may be performed as follows. Although not illustrated in FIG. 18, holes or trenches passing through the insulating material layers (1110 of FIG. 17) and the first conduction layers 1120 may be formed on the lower conduction layer 1105. Subsequently, the insulating material layers (1110 of FIG. 17) may be etched by providing an etchant to the insulating material layers exposed through the holes or trenches. Accordingly, the air gaps AG may be formed in spaces surrounded by the metal-organic framework layers 1115. Through the above-described processes, a semiconductor device according to an embodiment of the present disclosure may be manufactured.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. semiconductor device comprising:
   a gate structure comprising a gate electrode layer and an interlayer insulation structure which are alternately stacked;
   a dielectric structure disposed to contact a sidewall surface of the gate structure; and
   a channel layer disposed over a sidewall surface of the dielectric structure,
   wherein the interlayer insulation structure comprises a metal-organic framework layer and an inner insulation layer,
   wherein the metal-organic frame work layer contacts a surface of the gate electrode layer in a vertical direction, and
   wherein the inner insulation layer is spaced apart from the gate electrode layer and fills entire spaces between the metal-organic frame work layer in the vertical direction,
   wherein the inner insulation layer comprises at least one of oxide, nitride, and oxynitride.

2. The semiconductor device of claim 1, wherein the metal-organic framework layer is disposed to contact the gate electrode layer and the dielectric structure.

3. The semiconductor device of claim 1,
   wherein the metal-organic framework layer is disposed to surround the inner insulation layer.

4. The semiconductor device of claim 1, wherein the interlayer insulation structure further comprises an air gap, and wherein the metal-organic framework layer is disposed to surround the air gap.

5. The semiconductor device of claim 1, wherein the metal-organic framework layer has a porous structure.

6. The semiconductor device of claim 1, wherein the metal-organic framework layer comprises a metal-organic framework comprising a cavity.

7. The semiconductor device of claim 1, wherein the dielectric structure comprises:
   a barrier layer disposed on the sidewall surface of the gate structure;
   a charge storage layer disposed on a sidewall surface of the barrier layer; and
   a tunneling layer disposed on a sidewall surface of the charge storage layer.

8. The semiconductor device of claim 1, wherein the dielectric structure comprises:
   a ferroelectric memory layer disposed on the sidewall surface of the gate structure; and
   an interfacial insulation layer disposed on a sidewall surface of the ferroelectric memory layer.

9. The semiconductor device of claim 1, wherein the channel layer extends in the vertical direction.

10. The semiconductor device of claim 9, further comprising a channel lower contact layer and a channel upper contact layer which are disposed at opposite ends of the channel layer with respect to a direction substantially perpendicular to the surface of the substrate,
    wherein the channel lower contact layer and the channel upper contact layer are electrically connected to a source line and a bit line, respectively.

11. A semiconductor device comprising:
    a gate structure comprising a horizontal electrode layer and an interlayer insulation structure which are alternately stacked;
    a dielectric structure disposed to contact a sidewall surface of the gate structure; and
    a vertical electrode layer disposed over a sidewall surface of the dielectric structure and extending in a vertical direction,
    wherein the interlayer insulation structure comprises a metal-organic framework layer and an inner insulation layer,
    wherein the metal-organic frame work layer contacts a surface of the gate electrode layer in the direction, and
    wherein the inner insulation layer is spaced apart from the gate electrode layer and fills entire spaces between the metal-organic frame work layer in the vertical direction,
    wherein the inner insulation layer comprises at least one of oxide, nitride, and oxynitride.

12. The semiconductor device of claim 11, wherein the metal-organic framework layer is disposed to surround the inner insulation layer.

13. The semiconductor device of claim 11, wherein the interlayer insulation structure further comprises an air gap, and
    wherein the metal-organic framework layer is disposed to surround the air gap.

14. The semiconductor device of claim 11, wherein the metal-organic framework layer has a porous structure.

15. The semiconductor device of claim 11, wherein the metal-organic framework layer comprises a metal-organic framework comprising a cavity.

16. A semiconductor device comprising:
    a gate structure comprising a gate electrode layer and an interlayer insulation structure which are stacked;
    a dielectric structure disposed to contact a sidewall surface of the gate structure; and
    a channel layer disposed over a sidewall surface of the dielectric structure,
    wherein the interlayer insulation structure comprises a metal-organic framework and an inner insulation layer,
    wherein the metal-organic frame work contacts a surface of the gate electrode layer in a vertical direction, and
    wherein the inner insulation layer is spaced apart from the gate electrode layer and fills entire spaces between the metal-organic frame work in the vertical direction,
    wherein the inner insulation layer comprises at least one of oxide, nitride, and oxynitride.

* * * * *